(12) United States Patent
Sambongi

(10) Patent No.: US 8,805,642 B2
(45) Date of Patent: Aug. 12, 2014

(54) POSITIONING APPARATUS, POSITIONING METHOD, AND STORAGE MEDIUM

(75) Inventor: Masao Sambongi, Hachioji (JP)

(73) Assignee: Casio Computer Co., Ltd., Tokyo (JP)

( * ) Notice: Subject to any disclaimer, the term of this patent is extended or adjusted under 35 U.S.C. 154(b) by 418 days.

(21) Appl. No.: 13/223,955

(22) Filed: Sep. 1, 2011

(65) Prior Publication Data

US 2012/0053889 A1    Mar. 1, 2012

(30) Foreign Application Priority Data

Sep. 1, 2010    (JP) .................................. 2010-195241

(51) Int. Cl.
G06F 19/00    (2011.01)
G03F 7/20     (2006.01)

(52) U.S. Cl.
CPC ................................. *G03F 7/70775* (2013.01)
USPC ........................................................ 702/150

(58) Field of Classification Search
CPC .................................................. G03F 7/70775
USPC .................. 702/150, 151, 155, 182–185, 188
See application file for complete search history.

(56) References Cited

U.S. PATENT DOCUMENTS

| 5,311,195 A    | 5/1994 | Mathis et al. |
| 5,512,904 A    | 4/1996 | Bennett |
| 6,091,359 A    | 7/2000 | Geier |
| 2006/0189329 A1 | 8/2006 | Anderson |
| 2009/0167603 A1* | 7/2009 | Muraguchi ............. 342/357.12 |

FOREIGN PATENT DOCUMENTS

| EP | 0 687 892 A1 | 12/1995 |
| JP | 4-364491 A   | 12/1992 |
| JP | 2004-233186 A | 8/2004 |
| JP | 2006-177772 A | 7/2006 |
| WO | WO 93/05587 A1 | 3/1993 |
| WO | WO 99/04280 A1 | 1/1999 |

OTHER PUBLICATIONS

Japanese Office Action dated Jan. 22, 2013 (and English translation thereof) in counterpart Japanese Application No. 2010-195241.
Extended European Search Report (EESR) dated Dec. 22, 2011 (in English) in counterpart European Application No. 11179743.7.

* cited by examiner

Primary Examiner — Edward Raymond
(74) Attorney, Agent, or Firm — Holtz Holtz Goodman & Chick PC

(57) ABSTRACT

A positioning apparatus includes: a position measuring section to measure a present position of the positioning apparatus to obtain measured position data; a movement measuring section to measure a moving direction and a moving distance; a position calculating section to calculate the present position to obtain calculated position data by accumulating, with respect to reference position, moving data corresponds to the moving direction and the moving distance measured by the movement measuring section; a selecting section to compare accuracy of the measured position data with an accuracy index of the calculated position data to select more accurate position data; and a reference position setting section to set the measured position data as the reference position when the measured position data is selected by the selecting section; wherein the accuracy index of the calculated position data is set such that the accuracy falls correspondence with increasing distance from the reference position.

8 Claims, 4 Drawing Sheets

POSITIONING APPARATUS, POSITIONING METHOD, AND STORAGE MEDIUM

BACKGROUND OF THE INVENTION

1. Field of the Invention

The present invention relates to a positioning apparatus for obtaining migration path data of a mobile object, a positioning method therefor, and a storage medium.

2. Description of Related Art

There has been a positioning apparatus using a function of directly positioning its own present position by using a satellite positioning system, such as a GPS (global positioning system), in conjunction with a function of indirectly calculating its own present position by means of autonomous navigation using a motion sensor equipped with, for example, an acceleration sensor and an azimuth sensor.

This positioning apparatus measures a moving direction and a moving distance of a mobile object, such as a walker or a motorcar, by using the motion sensor.

Then, this positioning apparatus sets a measured position obtained by using the satellite positioning system as a reference point and sequentially integrates the information of moving directions and displacement quantities to the reference point, and thereby the positioning apparatus can obtain locus data of a path along which the mobile object has moved.

The accuracy of the measured positions in the positioning using the satellite positioning system changes according to the location of positioning satellites, the electric waves of which have been received by the positioning apparatus, and the ambient environment including a building and the like.

Consequently, the positioning apparatus has a problem such that there is a case where the measured position includes a large measurement error in some conditions at the time of positioning.

Accordingly, Japanese Patent Application Laid-Open Publication No. 2004-233186 discloses a positioning apparatus that compares a parameter value indicating the accuracy of a measured position measured by a satellite positioning with a predetermined threshold value and calculates the present position by using the information of a moving direction and a moving distance that are measured with a motion sensor when the accuracy of the measured position measured by the satellite positioning is lower than a level set in accordance with the threshold value.

However, the error of the measurement included in the information of moving directions and displacement quantities obtained by autonomous navigation becomes larger by being accumulated in the information of the moving directions and the displacement quantities at each measurement, as the autonomous navigation is being continued.

Consequently, the positioning apparatus has a problem of the impossibility of obtaining accurate position data and locus data owing to the influence of the accumulation of errors included in the information of the moving directions and the displacement quantities that are calculated by adopted autonomous navigation.

SUMMARY OF THE INVENTION

It is therefore an object of the present invention to provide a positioning apparatus capable of obtaining position data and locus data that have high positioning accuracy, a positioning method therefor, and a storage medium.

According to an aspect of the present invention, there is provided a positioning apparatus, including: a position measuring section to measure a present position of the positioning apparatus to obtain measured position data; a movement measuring section to measure a moving direction and a moving distance; a position calculating section to calculate the present position of the positioning apparatus to obtain calculated position data by accumulating, with respect to a reference position, moving data corresponds to the moving direction and the moving distance measured by the movement measuring section; a position selecting section to compare a measuring index indicating accuracy of the measured position data with a calculating index indicating accuracy of the calculated position data, and to select one of the measured position data and the calculated position data based on which of the measuring index and the calculating index is more accurate; and a reference position setting section to set the measured position data obtained by the position measuring section as the reference position when the measured position data is selected by the position selecting section; wherein the calculating index of the calculated position data is set such that the accuracy indicated by the calculating index falls correspondence with increasing distance from the reference position.

According to another aspect of the present invention, there is provided a positioning method of obtaining position data based on measured position data from a position measuring section to measure a present position and moving data from a movement measuring section to measure a moving direction and a moving distance as the moving data, the method comprising the steps of: calculating the present position to obtain calculated position data by accumulating, with respect to a reference position, the moving data corresponds to the moving direction and the moving distance; comparing a measuring index indicating accuracy of the measured position data with a calculating index indicating accuracy of the calculated position data, and to select one of the measured position data and the calculated position data based on which of the measuring index and the calculating index is more accurate; and setting the measured position data as the reference position when the measured position data is selected at the step of comparing; wherein the calculating index of the calculated position data is set such that the accuracy indicated by the calculating index falls correspondence with increasing distance from the reference position.

According to another aspect of the present invention, there is provided a storage medium recording a program for a computer to be used for a positioning apparatus including a position measuring section to measure a present position of the positioning apparatus to obtain measured position data and a movement measuring section to measure a moving direction and a moving distance, the program making the computer function as: a position calculating section to calculate the present position of the positioning apparatus to obtain calculated position data by accumulating, with respect to a reference position, moving data corresponds to the moving direction and the moving distance; a position selecting section to compare a measuring index indicating accuracy of the measured position data with a calculating index indicating accuracy of the calculated position data, and to select one of the measured position data and the calculated position data based on which of the measuring index and the calculating index is more accurate; and a reference position setting section to set the measured position data as the reference position when the measured position data is selected by the position selecting section; wherein the program sets the calculating index of the calculated position data such that the accuracy indicated by the calculating index falls correspondence with increasing distance from the reference position.

BRIEF DESCRIPTION OF THE DRAWINGS

The above and other objects, advantages and features of the present invention will become more fully understood from the detailed description given hereinbelow and the appended drawings which are given by way of illustration only, and thus are not intended as a definition of the limits of the present invention, and wherein.

DESCRIPTION OF THE PREFERRED EMBODIMENTS

In the following, an embodiment of the present invention will be described with reference to the accompanying drawings.

Figure 1:
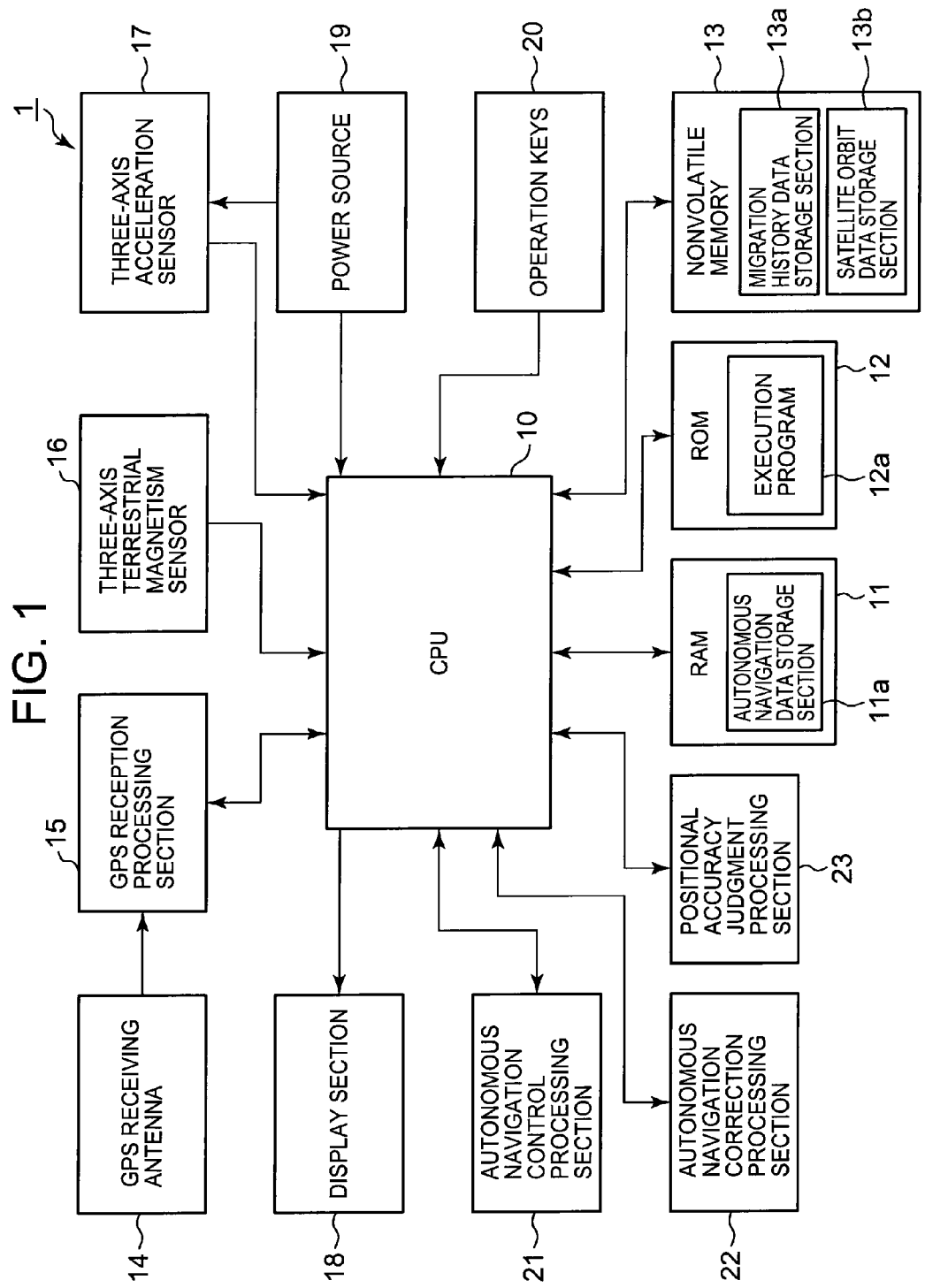
FIG. 1 is a block diagram showing the configuration of the positioning apparatus of an embodiment of the present invention.

FIG. 1 is a block diagram showing the configuration of the positioning apparatus of an embodiment of the present invention.

The positioning apparatus 1 of this embodiment is used by a user who is a walker with the user wearing the positioning apparatus 1. The positioning apparatus 1 includes a CPU (central processing unit) 10 (reference position setting section) to perform an integrated control and arithmetic processing of the operation of the whole apparatus, a RAM (random access memory) 11 to provide a working memory space for the CPU 10, a ROM (read only memory) 12 to store an execution program and set data, a nonvolatile memory 13, a GPS receiving antenna 14, a GPS reception processing section 15 as a position measuring section to measure a present position of the positioning apparatus 1 to obtain measured position data, a three-axis terrestrial magnetism sensor 16, a three-axis acceleration sensor 17, a display section 18 (display section), a power source 19 to supply electric power to the CPU 10 and the three-axis acceleration sensor 17, operation keys 20, an autonomous navigation control processing section 21 (position calculating section), an autonomous navigation correction processing section 22 (calculated position data correcting section), a positional accuracy judgment processing section 23 (position selecting section, accuracy judging section), and the like.

The RAM 11 further includes an autonomous navigation data storage section 11a (calculated position data storage section) to store calculated position data calculated by the autonomous navigation control processing section 21.

The autonomous navigation data storage section 11a can store a sequentially transmitted plurality of pieces of calculated position data in order.

The ROM 12 stores an execution program 12a for making the positioning apparatus 1 of the present embodiment perform positioning processing.

The CPU 10 reads the execution program 12a therein at the time of power activation or based on an input instruction from the operation keys 20 to execute the execution program 12a.

The program 12a can also be stored in the nonvolatile memory 13.

Alternatively, the execution program 12a can also be recorded in a portable recording medium, such as a CD-ROM (compact disk read only memory) or a flash memory, and can be executed by the CPU 10 through a reading apparatus.

Moreover, it is also possible to adopt a form of downloading the program 12a to the positioning apparatus 1 through a communication line using a carrier wave as a medium.

The nonvolatile memory 13 is, for example, an EEPROM (electrically erasable and programmable read only memory).

The nonvolatile memory 13 includes a migration history data storage section 13a to store movement position data determined by control processing of the CPU 10 in order, and a satellite orbit data storage section 13b to store ephemeris data, which is orbit data of a GPS satellite.

Moreover, the nonvolatile memory 13 can store map data, and the map data read out by the CPU 10 is displayed in the display section 18.

The GPS reception processing section 15 demodulates electric wave signals received by the GPS receiving antenna 14 from a plurality of GPS satellites, based on a control signal input from the CPU 10.

Moreover, the GPS reception processing section 15 performs arithmetic processing based on these demodulated signals and outputs worked-out data (measured position data) to the CPU 10 in a set format.

The format capable of being output from the GPS reception processing section 15 includes, for example, a format in conformity with the standard of NMEA (National Marine Electronics Association)-0183.

GPS measured position data operated by the GPS reception processing section 15 includes errors.

The size of the error range of the GPS measured position data changes according to the number of the GPS satellites used for the arithmetic processing and the location of the GPS satellites.

The data output from the GPS reception processing section 15 includes a GST (Galileo System Time) message output (GNSS (Global Navigation Satellite System) Pseudo Error Statistics) as an index (measuring index indicating accuracy of the measured position data) indicating the error range of such a GPS measured position.

Concretely, the GST message output includes statistical error items, such as the values of the standard deviations of the radii of the major axis and the minor axis of an ellipse indicating an error range of the GPS measured position and the values of the standard deviations of the tilt angle of the ellipse, a latitude error, a longitude error, and a height error.

The three-axis terrestrial magnetism sensor 16 is a sensor using, for example, a magnetoresistive element and three-dimensionally measures the azimuth of terrestrial magnetism to output the measured azimuth to the CPU 10.

Moreover, the three-axis acceleration sensor 17 measures the acceleration in each of the three axial directions thereof to output the measured acceleration to the CPU 10.

These three-axis terrestrial magnetism sensor 16 and three-axis acceleration sensor 17 constitute a movement measuring section to measure a moving direction and a moving distance of the positioning apparatus 1.

The autonomous navigation control processing section 21 calculates a moving direction and a moving distance of the positioning apparatus 1 based on the respective pieces of measured data transmitted from the three-axis terrestrial magnetism sensor 16 and the three-axis acceleration sensor 17 to the CPU 10.

For example, the autonomous navigation control processing section 21 measures the number of steps of the user wearing the positioning apparatus 1 based on the acceleration changes in a direction of gravitational force and calculates the moving distance of the user by multiplying the number of measured steps by a previously set stride.

Then, the autonomous navigation control processing section 21 calculates calculated position data based on the calculated moving distance, moving direction and original position data to transmit the calculated position data to the CPU 10. That is, the autonomous navigation control processing section 21 calculates the present position of the positioning apparatus to obtain calculated position data by accumulating, with respect to a reference position, moving data corresponds to the moving direction and the moving distance measured by the movement measuring section 16, 17.

The calculated position data is stored in the autonomous navigation data storage section 11*a*.

The calculated position data calculated by the autonomous navigation control processing section 21 includes errors produced at a certain rate for a calculated moving distance when a certain shift exists between the set stride and an actual stride.

That is, the errors of the moving distances calculated by the autonomous navigation control processing section 21 are continually accumulated as the user advances along a moving path.

Moreover, an azimuth error caused by an offset of the positioning apparatus 1 into a certain direction owing to the magnetization thereof and a temporary azimuth error caused by the influences of the surrounding environment are produced in the three-axis terrestrial magnetism sensor 16.

Consequently, the influences of the errors appear also in the calculated position data.

Figure 2:
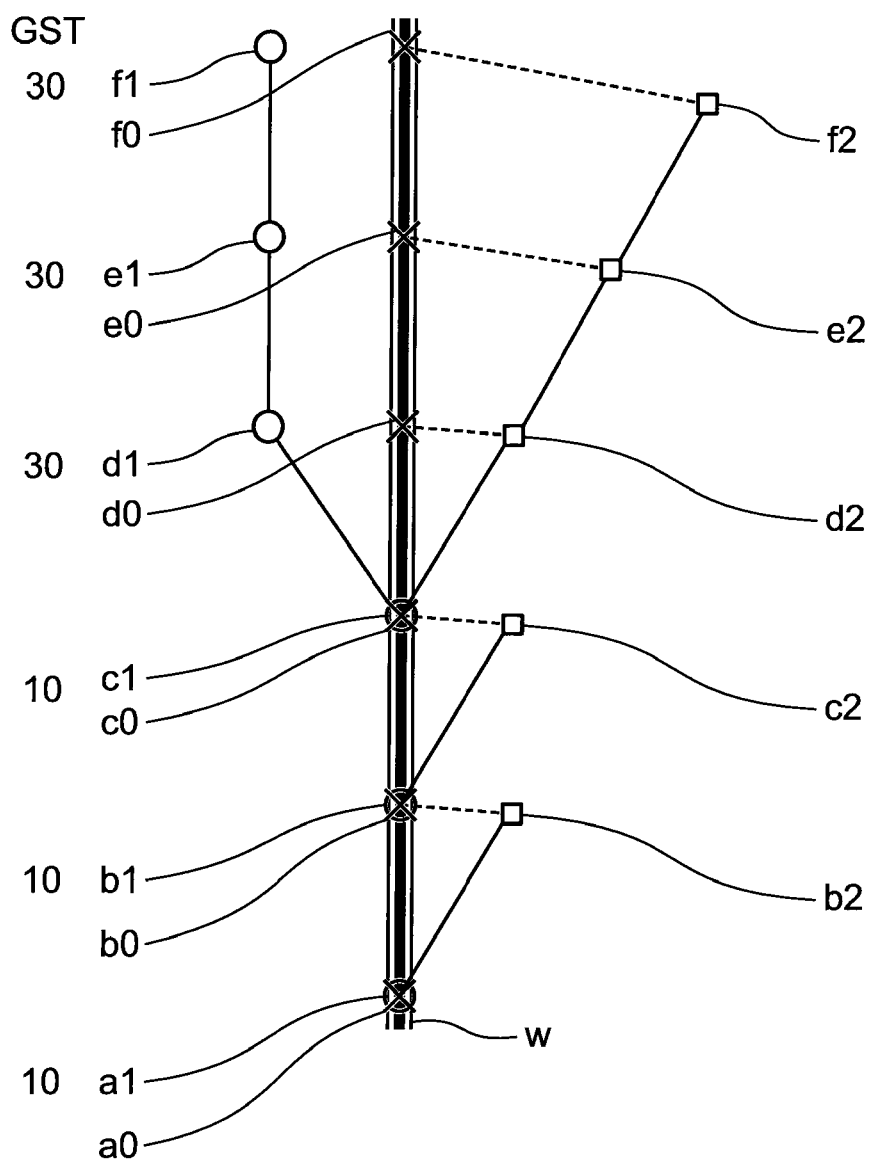
FIG. 2 is a diagram showing a method of obtaining path data.

FIG. 2 is a diagram showing a method of calculating the position of the user wearing the positioning apparatus 1 by the positioning using the GPS and by the autonomous navigation.

For example, the user moves straight on a path w through the respective spots of from a spot a0 to a spot f0, each indicated by a mark "x".

The measured positions obtained by the positioning using the GPS at the moving time at predetermined time intervals (for example, every second) are displayed as spots a1-f1 by using marks "O".

Moreover, the error range (for example, the value of larger one between the standard deviations of a latitude error and a longitude error indicated by a GST message (both deviations are notated by meters); the value will hereinafter be referred to as a GST error) of the measured position data of each of the spots a1-f1 obtained by the positioning using the GPS is displayed on the left side of each of the spots a1-f1.

On the other hand, each of the positions calculated by autonomous navigation at almost the same time as the timing of obtaining each of the spots b1-f1 by the positioning using the GPS is displayed as each of spots b2-f2 by using a mark "□".

As shown in FIG. 2, each of the GST errors of the spots a1-c1 obtained by the positioning using the GPS is 10 m.

The magnitudes of the GST errors correspond to the values expected in the case where all of the electric waves from the GPS satellites on the horizon can clearly be received in the ordinary positioning using the GPS.

The obtained spots a1-c1 are almost correctly obtained on the path w.

Compared with this, the GST errors of the spots d1-f1 obtained by the positioning using the GPS are 30 m.

Moreover, the spots d1-f1 are obtained to be deviated from the correct spots d0-f0 on the path w (by, for example, several meters).

As shown in FIG. 2, the spots b2-f2 can be obtained based on the data of the moving distances and the moving directions calculated by the autonomous navigation.

At this time, the spots b2-f2 can be obtained by using the measured position data obtained by the last positioning using the GPS as reference positions (for example, the spots a1-c1).

Offsets of almost a clockwise constant angle from the path w and the errors of moving distances each longer than each of actual strides by about 10% appear in the obtained positions (spots b2-d2).

Moreover, the errors of moving directions and moving distances for two times are accumulated to appear at a position (spot e2) calculated based on the spot d2 calculated by autonomous navigation and the moving distance and the moving direction calculated by the next autonomous navigation.

Furthermore, the errors of moving directions and moving distances for three times are accumulated to appear at a position (spot f2) calculated based on the spot e2 and the moving distance and the moving direction calculated by the next autonomous navigation.

The autonomous navigation correction processing section 22 corrects each of the calculated position data calculated by autonomous navigation and stored in the autonomous navigation data storage section 11*a* based on the measured positions obtained by the GPS before and after the autonomous navigation, that is, based on the reference position and a last reference position which is set by the reference position setting section 10.

The corrected calculated position data obtained by the autonomous navigation is stored in the nonvolatile memory 13 as a definite value.

The positional accuracy judgment processing section 23 performs the processing of selecting the method of data processing based on the magnitude of the error of each of measured position data measured by the GPS and obtained from the GPS reception processing section 15 and position data obtained by autonomous navigation obtained from the autonomous navigation control processing section 21.

Moreover, the positional accuracy judgment processing section 23 judges whether the accuracy of a measured position measured by the GPS is sufficient or not by comparing the error range of the measured position measured by the GPS with a previously set threshold value. That is, the positional accuracy processing section 23 compares the measuring index with a calculating index indicating accuracy of the calculated position data to select one of the measured position data and the calculated position data based on which of the measuring index and the calculating index is more accurate.

The display section 18 is a screen to perform a display by, for example, liquid crystal.

Alternatively, a display section of another system, such as an organic EL (electro-luminescent) display, may be used as the display section 18.

The display section 18 can read out map data from the nonvolatile memory 13 to display it thereon, and can display a mark indicating an obtained position and a line indicating the locus of a movement by superposing the mark and the line on the map.

Moreover, the display section 18 is configured in such a way that it is possible at this time to simultaneously display an ellipse indicating the error range of the mark indicating each position displayed in the display section 18 based on, for example, the error range information decoded from a GST message output.

That is, the display section 18 displays the position data selected by the position selecting section 23 and an error range based on the measuring index or the calculating index of the position data.

Next, operational contents of positioning processing will be described with reference to a flow chart.

Figure 3:
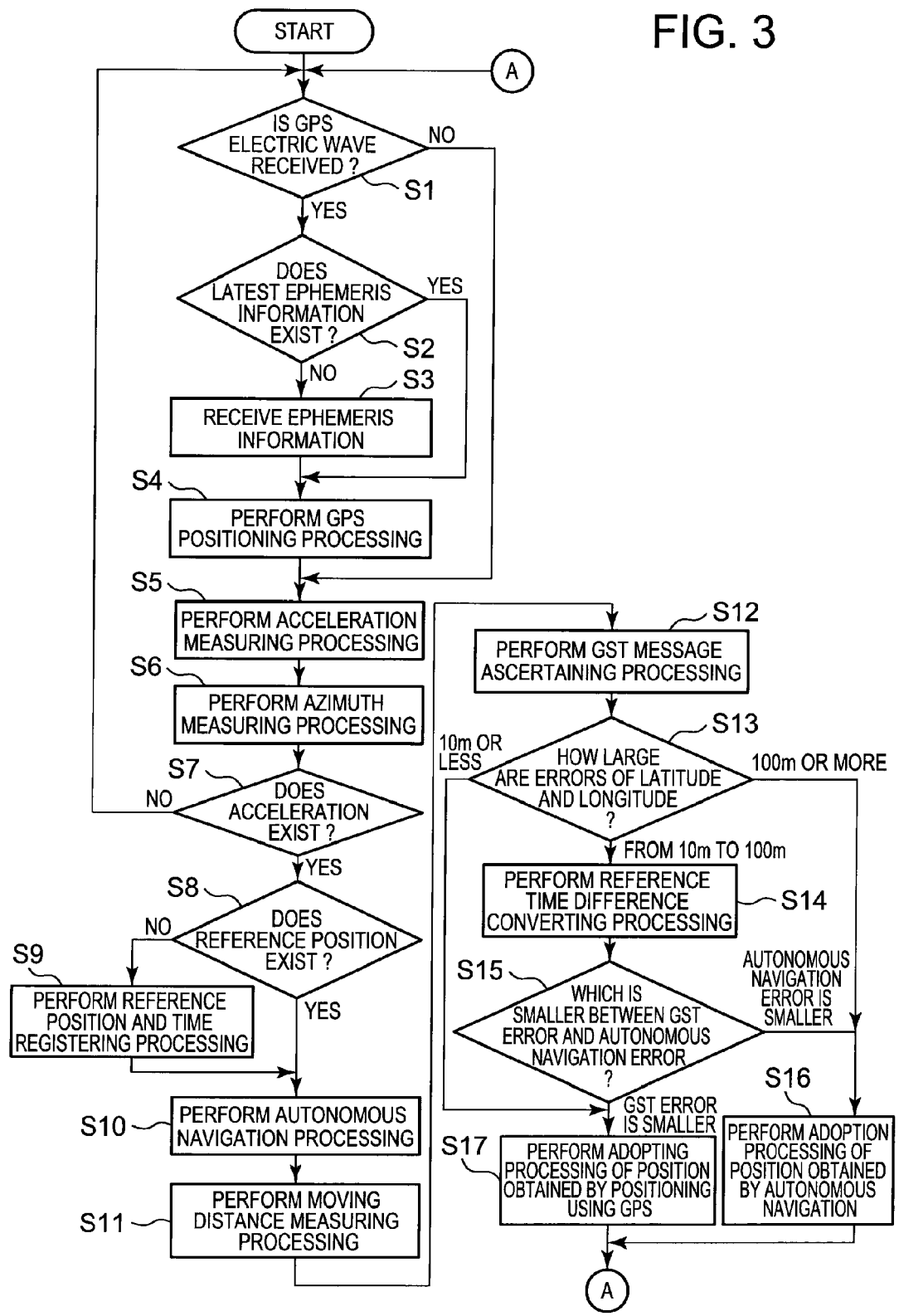
FIG. 3 is a flow chart showing the processing of obtaining the path data.

FIG. 3 is a flow chart showing the procedure of positioning control processing executed by the CPU 10.

The positioning control processing of the present embodiment is started by an input signal based on a user's operation of the operation keys 20.

When the positioning control processing is started, the CPU 10 first transmits a signal to the GPS reception processing section 15 to start reception processing.

Then, the CPU 10 judges whether an electric wave from a GPS satellite is received or not based on a signal input from the GPS reception processing section 15 (Step S1).

Then, if it is judged that an electric wave from a GPS satellite is received, the CPU 10 successively judges whether the latest ephemeris data is stored in the satellite orbit data storage section 13b or not (Step S2).

If it is judged that the latest ephemeris data is not stored in the satellite orbit data storage section 13b, the CPU 10 obtains received ephemeris data from the GPS reception processing section 15 to make the satellite orbit data storage section 13b store the received ephemeris data (Step S3).

Then, the CPU 10 moves the present processing to that at Step S4.

If it is judged that the latest ephemeris data is already stored, the CPU 10 moves the present processing to that at Step S4 as it is.

Next, the CPU 10 performs positioning processing by the GPS of obtaining the present position information obtained by positioning by the GPS from input data from the GPS reception processing section 15 (Step S4).

Then, the CPU 10 moves the present processing to that at Step S5.

If it is judged that no electric waves from the GPS satellites are received in the judgment processing at Step S1, the CPU 10 moves the present processing to that at Step S5 without performing the processing at Steps S2-S4.

After moving the present processing to that at Step S5, the CPU 10 obtains the data of a necessary period (for example, a period from a time at which the last positioning processing by the GPS has been performed to a time at which the present positioning processing by the GPS has been performed) from the data of three-axis acceleration measured with the three-axis acceleration sensor 17.

Successively, the CPU 10 obtains the azimuth data of a necessary period from the three-axis terrestrial magnetism data measured with the three-axis terrestrial magnetism sensor 16 (Step S6).

Next, the CPU 10 judges whether the obtained three-axis acceleration data include acceleration other than the gravitational acceleration or not (Step S7).

If it is judged the three-axis acceleration data does not include any acceleration other than the gravitational acceleration, the CPU 10 judges that the user, who is a walker, has not moved from the last measured position, and returns the present processing to that at Step S1.

On the other hand, if it is judged that the three-axis acceleration includes acceleration other than the gravitational acceleration in the judgment processing at Step S7, the CPU 10 judges whether any reference position data is set or not (Step S8).

It is judged that no reference position data exists just after the start of the positioning control processing, and the CPU 10 sets the measured position data and the time data obtained in the first positioning processing by the GPS (at Step S4) as the initial values of the reference position and the reference time, respectively, and registers the initial values into the RAM 11 (Step S9).

These initial values are set independent of the magnitudes of their errors and are displayed in the display section 18 together with error information.

Then, the CPU 10 moves the present processing to that at Step S10.

It is judged that the reference position data exists in the judgment processing at Step S7 after the initial values of the reference position data have once been set and registered, and the CPU 10 moves the present processing to that at Step S10 as it is at Step S7.

When the CPU 10 has moved the present processing to that at Step S10, the CPU 10 performs autonomous navigation processing.

In the autonomous navigation processing, the CPU 10 makes the autonomous navigation control processing section 21 calculate the traveling direction based on the obtained three-axis acceleration data and the three-axis terrestrial magnetism data, and makes the autonomous navigation control processing section 21 converts the coordinate system of the three-axis acceleration data into a coordinate system having the coordinate axes in the gravitation direction and the traveling direction.

Then, the CPU 10 makes the autonomous navigation control processing section 21 calculates the number of steps of a user's movement based on the pattern of time-series changes of the gravitation direction component of this three-axis acceleration data.

Moreover, the CPU 10 performs moving distance measuring processing (Step S11).

In this moving distance measuring processing, the CPU 10 makes the autonomous navigation control processing section 21 calculate a moving distance in a set period based on the calculated number of steps of the movement to obtain the moving distance.

Next, the CPU 10 develops the GST message obtained from the GPS reception processing section 15 (Step S12: GST message ascertaining processing).

The CPU 10 sets a GST error value based on the developed GST message.

Then, the CPU 10 makes the positional accuracy judgment processing section 23 evaluate the magnitude of the GST error (Step S13).

First, if it is judged that the GST error is equal to or less than a previously set threshold value, for example, 10 m, the CPU 10 judges that the reliability of the obtained measured position data is high.

After that, the CPU 10 moves the present processing to that at Step S17.

On the other hand, if it is judged that the GST error is equal to or more than another previously set threshold value, for example, 100 m, the CPU 10 judges that the reliability of the obtained measured position data is low.

After that, the CPU 10 moves the present processing to that at Step S16.

If it is judged that the GST error is within a range of from 10 m to 100 m, the CPU 10 moves the present processing to that at Step S14.

When the present processing has moved to that at Step S14, the CPU 10 performs the processing of converting a time difference from the reference position into an autonomous navigation error.

In the processing of converting the time difference from the reference position into the autonomous navigation error, the CPU 10 first converts an elapsed time from the set time of the reference position, which set time has been set before and is set now, to the timing of performing the next positioning by the GPS into a movable distance based on a previously set movement speed.

Then, the CPU 10 calculates a distance error based on the movable distance and a predetermined accuracy (%) in the autonomous navigation, and sets the calculated distance error as the value of the autonomous navigation error.

Consequently, the autonomous navigation error monotonously increases as the elapsed time from the time at which the reference position has been set becomes longer.

Next, the CPU 10 transmits the obtained value of the autonomous navigation error and the GST error value to the positional accuracy judgment processing section 23, and makes the positional accuracy judgment processing section 23 perform positional accuracy judgment processing (Step S15).

If it is judged that the value of the autonomous navigation error is smaller than the GST error value, the CPU 10 moves the present processing to that of Step S16.

On the other hand, if it is judged that the GST error value is smaller than the value of the autonomous navigation error, the CPU 10 moves the present processing to that at Step S17.

When the present processing has moved to that at Step S16, the CPU 10 executes adoption processing of the position obtained by the autonomous navigation.

In this adoption processing, the CPU 10 adopts the calculated position obtained by adding the moving direction and the moving distance calculated in the moving distance measuring processing at Step Sli to the position information obtained at the last time.

Then, the CPU 10 makes the autonomous navigation data storage section 11a store the calculated position data adopted in the autonomous navigation position adopting processing together with the time data.

Moreover, the CPU 10 makes the display section 18 display the set calculated position and the moving path together with the error range of the calculated position.

Then, the CPU 10 returns the present processing to that at Step S1.

On the other hand, when the present processing has moved to that at Step S17, the CPU 10 executes the adoption processing of the position data obtained by the positioning using the GPS.

In this adoption processing, the CPU 10 first adopts the measured position obtained by the positioning using the GPS.

If there is calculated position data stored in the autonomous navigation data storage section 11a on and after the last setting and registration of the reference position, the CPU 10 transmits the calculated position data, the last reference position data, and the determined measured position data by the positioning using the GPS to the autonomous navigation correction processing section 22.

Then, the CPU 10 makes the autonomous navigation correction processing section 22 perform the correction processing of calculated position data obtained by the autonomous navigation, which correction processing will be described later.

Next, the CPU 10 makes the migration history data storage section 13a store corrected calculated position data and corrected measured position data, both obtained from the autonomous navigation correction processing section 22, in the order of time data.

The CPU 10 makes the display section 18 display the position, the error range thereof, and the moving path based on the corrected position data, which is stored in the migration history data storage section 13a.

Then, the CPU 10 updates and registers the measured position data and the obtainment time of the measured position data into the RAM 11 as reference position data and reference time data, respectively.

After that, the CPU 10 returns the present processing to that at Step S1.

Although the flow chart described above shows the procedure in which the CPU 10 makes the positional accuracy judgment processing section 23 perform only the judgment processing at Steps S13 and S15, it is also acceptable to make the positional accuracy judgment processing section 23 perform all of the pieces of processing at Steps S13-S15.

Moreover, although the flow chart described above shows the procedure in which the CPU 10 performs the setting of the initial position after starting a movement, it is also acceptable to perform the setting of the initial position at the stage of obtaining the measured position data measured by the GPS at first.

Moreover, it is also acceptable to update and register the setting of the initial position without user's movement when the GST error value becomes small.

Next, a concrete example of position determination in the positioning apparatus 1 of the present embodiment will be described.

Figure 4:
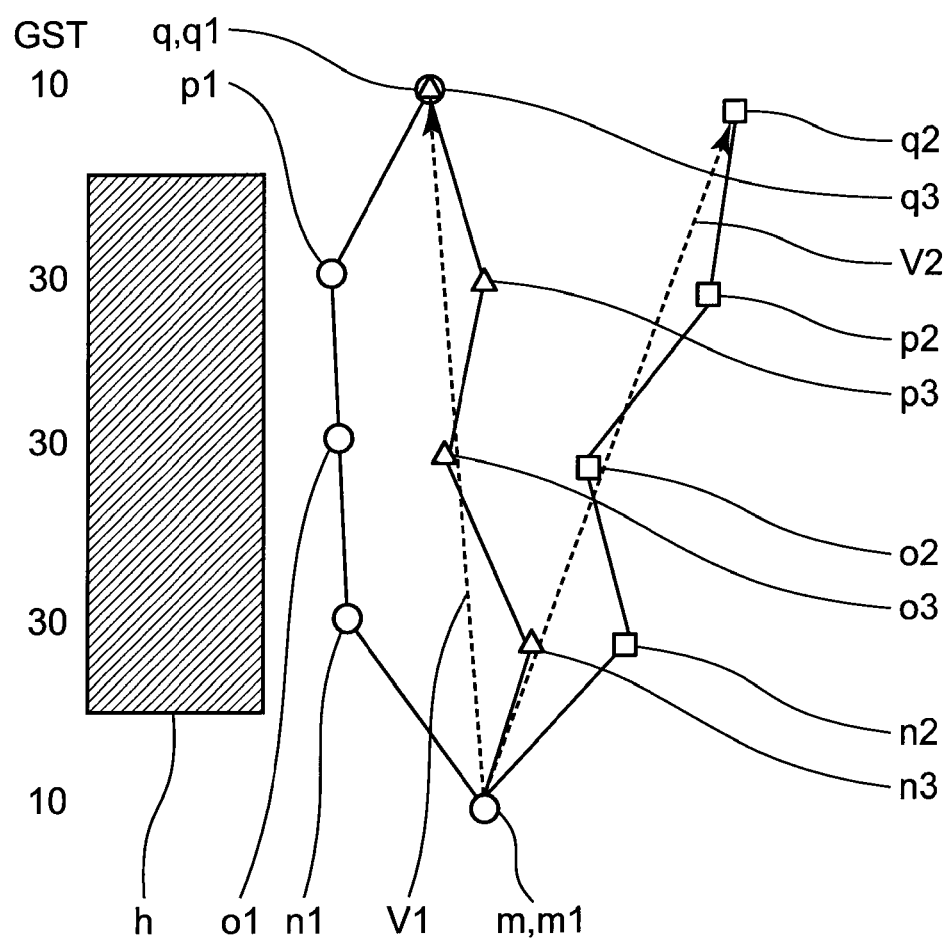
FIG. 4 is a diagram showing an example of obtained the path data.

FIG. 4 is a diagram showing an example of positioning by the positioning apparatus 1 of the present embodiment.

In the example of the positioning shown in FIG. 4, a user wearing the positioning apparatus 1 moves from a spot m to a spot q by passing by a multistory building h.

First, when positioning control processing is started, the positioning apparatus 1 receives an electric wave from the GPS satellite (Step S1), and obtains the latest ephemeris data when the latest ephemeris data is not stored in the satellite orbit data storage section 13b (Steps S2 and S3).

Then, the positioning apparatus 1 performs positioning processing by the GPS (Step S4).

The data of the position (spot m1, mark "O") positioned at this time and the time is set as the initial values of the reference position and the reference time, respectively, to be registered in the RAM 11 (Steps S8 and S9).

Moreover, the measured positions (spots n1-q1, mark "O") to which the user has moved have been obtained at, for example, the intervals of five seconds on and after the second positioning processing by the GPS, respectively.

On the other hand, when an acceleration change owing to the user's movement (Steps S5-S7), the number of steps of the user is calculated from the measured data of the three-axis acceleration sensor 17 and the measured data of the three-axis terrestrial magnetism sensor 16, both incorporated in the positioning apparatus 1, and further a moving distance and a movement azimuth are output (Steps S10 and S11).

Next, the positioning apparatus 1 develops the respective GST message outputs pertaining to the measured positions (spots m1-q1) obtained by the positioning processing by the GPS to obtain GST errors (Step S12).

Each of the pieces of positioning accuracy of the spots m1 and q1 by the GPS is a GST error of 10 m.

The adoption processing of the positions (measured positions) by the positioning by the GPS is accordingly performed, and these measured positions are set as reference positions (Steps S13 and S17).

In contrast to this, all of the GST errors of measured positions n1-p1 by the GPS obtained at a side of the multistory building h are 30 m.

Each of the GST errors in the intervals of the measured positions n1-p1 by the GPS is accordingly compared with the autonomous navigation errors (Step S15) calculated based on the elapsed time from the set time of the reference position m1 (Step S14).

Then, if the autonomous navigation errors of the intervals are smaller than each of the GST errors, calculated positions n2-p2 (each of which is denoted by a mark "□") calculated by autonomous navigation are adopted in adoption processing of position obtained by autonomous navigation (Step S16).

That is, the calculated positions o2-q2 calculated by the autonomous navigation are calculated as the moving distances and the movement azimuths from the spots n2-p2, respectively, and the errors of the moving distances are gradually accumulated, and further angle errors into an almost constant direction appear.

The GST error of the measured position q1 by the GPS is recovered to 10 m.

In the adoption processing (Step S17) of positions by the positioning using the GPS executed at this time, the correction processing of the spots n2-p2 of the calculated positions calculated by the autonomous navigation is performed.

Concretely, first, a conversion matrix T is calculated for according the vector V2 from the former reference position m1 to the autonomous navigation position q2 to the vector V1 from the former reference position m1 to the new reference position q1 by performing a rotation operation, and expansion and contraction operations to the vector V2.

That is, V1=TV2 is concluded by the conversion matrix T.

Then, the correction processing determines the spots n3-p3 (each denoted by a mark "Δ") as calculated position data which spots n3-p3 are obtained by a rotation operation, and expansion and contraction operations of each vector from the former reference position m1 to each of the spots n2-p2 by the conversion matrix T.

Moreover, here, even if the GST error of the measured position q1 by the GPS remains 30 m, the accumulated autonomous navigation error of the spot q2 becomes 32 m if an autonomous navigation error of, for example, 8 m is added to each of the calculated positions n2-q2 by the autonomous navigation.

Accordingly, because the autonomous navigation error is larger than the GST error value, the spot q1 is set as the reference position still to perform the correction processing of the spots n2-p2.

According to the embodiment, the calculated position data correcting section 22 performs a rotation operation, and expansion and contraction operations for each of vectors from the last reference position to each of positions calculated by the position calculating section 21 so that a vector from the last reference position to the calculated position calculated at a setting timing of the reference position set by the reference position setting section 10 accords with a vector from the last reference position to the reference position.

As described above, the positioning apparatus 1 of the present embodiment can directly compare an error range of positioning by the GPS and an error range by autonomous navigation every time by prescribing the error range of the positioning by the GPS by using a GST message output.

Then, if sufficient accuracy cannot obtained by the positioning by the GPS, the positioning apparatus 1 can select a position including a smaller error between a calculated position by the autonomous navigation and a measured position by the GPS, and consequently the positioning apparatus 1 can always obtain highly accurate position data.

Moreover, because the positioning apparatus 1 sets only accurate measured position data determined by positioning by the GPS as a reference position, the positioning apparatus 1 can obtain the measured position data in consideration of an accumulated error range by autonomous navigation after setting the reference position.

Consequently, the positioning apparatus 1 can select more accurate position data in consideration of the influences increasing owing to the accumulation of autonomous navigation errors even in a similar situation of GST errors.

Moreover, because the positioning apparatus 1 corrects calculated position data obtained by autonomous navigation based on measured position data by the GPS of two points, the positioning apparatus 1 can backward remove accumulated errors of moving distances and angle errors by autonomous navigation.

Moreover, the positioning apparatus 1 can decrease the errors of calculated position data obtained by autonomous navigation which errors are being accumulated to an almost even level.

Moreover, because the positioning apparatus 1 performs the correction processing of positions by autonomous navigation by means of a linear conversion, such as a combination of a rotation operation and expansion and contraction operations of a vector, the positioning apparatus 1 does not need any difficult processing and can simply perform accurate correction.

Moreover, because the positioning apparatus 1 performs the adoption processing of each of a measured position by the GPS and a calculated position by autonomous navigation without performing the comparison of the magnitude of each of the measured position and the calculated position with an estimated error by autonomous navigation when an error range of positioning by the GPS is 10 m or less or 100 m or more, respectively, a situation of removing sufficiently accurate data or of using apparently inaccurate data can be avoided.

Moreover, because the positioning apparatus 1 displays not only position data but also error data on a display screen of a position and a path data, a user can use the displayed information, grasping how accurate the position data is.

[Modification 1]

The CPU 10 can omit the branch of the case where the GST error is 10 m or less at Step S13 in the flow chart shown in FIG. 3 in the positioning apparatus of the embodiment described above.

In this case, the CPU 10 calculates a path in conformity with a moving distance and a movement azimuth obtained by autonomous navigation until an autonomous navigation error becomes larger than a corresponding GST error even if the GST error is 10 m or less, and performs the correction processing when the autonomous navigation error becomes larger than the GST error.

Because the positioning apparatus 1 can obtain position data in an error range of autonomous navigation even if a moving path is a path of ordinary limit accuracy or less of positioning by the GPS, accurate path data can always be obtained by the modification 1.

Moreover, because the positioning apparatus 1 can obtain detailed data of a moving path without performing any collation of road information or the like, the positioning apparatus 1 can perform the obtainment of accurate path data at the time of passing the interior of a house and a place to which no road data exists, such as a square and a mountain path.

[Modification 2]

When the CPU 10 judges that an autonomous navigation error becomes larger than a GST error value at Step S15 of the flow chart shown in FIG. 3 in the positioning apparatus 1 of the embodiment described above, and if the GPS error is larger than 10 m when the CPU 10 performs the correction of a path performed in the adoption processing of a measured position by the GPS at Step S17 and the setting processing of a reference position, then the CPU 10 makes, for example, the autonomous navigation data storage section 11a store the corrected path and set data of the reference position for a further certain period as provisional values.

Then, afterward, if a GST error falls into 10 m or less, the CPU 10 calculates conversion matrices T1 and T2 for performing the rotation, the expansion and the contraction conversion of each of a vector from the initial reference position to the provisional reference position and a vector from the initial reference position to an autonomous navigation position until the GST error falls into 10 m or less, respectively, and performs the correction of the calculated position data.

On the other hand, if the GST error does not fall into 10 m or less in a certain period, the CPU 10 settles the corrected path and the provisional reference position as position data.

In such a positioning apparatus of the modification 2, the CPU 10 performs the correction processing of measured position data based on the positioning data by the GPS which data includes GST errors of 10 m or less as much as possible, and performs correction processing by using measured position data by the GPS with the same or more accuracy as that of calculated position data obtained by autonomous positioning even if the GST errors do not recover to 10 m or less.

The possibility that inaccurate position data is included in the locus data to be finally recorded is consequently low, and the positioning apparatus can wholly perform accurate correction.

According to the embodiment, the calculating index of the calculated position data is set such that the accuracy indicated by the calculating index falls correspondence with increasing distance from the reference position.

The present invention is not limited to the embodiment described above, but can be changed variously.

For example, although the positioning apparatus 1 uses the data of a GST message output as an error of positioning by the GPS in the embodiment described above, other indices may be used.

For example, the positioning apparatus 1 may also prescribe the error range of a moving distance based on a value of PDOP (position dilution of precision) included in a GSA (GPS DOP (dilution of precision) and active satellites) message output by the standard of NMEA-0183 and a reception frequency.

For example, the positioning apparatus 1 can use 2 drms (twice distance root mean square) of the PDOP.

Moreover, although an estimated error indicating the accuracy of the calculated position data obtained by autonomous navigation is obtained based on the elapsed time from the time when the reference position has been set in the embodiment described above, other methods may be used.

For example, it is also possible that the positioning apparatus 1 uses a multiplication result of the data of the number of steps counted in the autonomous navigation processing (Step S10) and previously set stride data, or a value obtained by further multiplying the value of the multiplication result by a predetermined coefficient α (0<α<1) as a value indicating the accuracy of calculated position data by autonomous navigation.

Moreover, although the positioning apparatus 1 performs satellite positioning by using the data of GPS satellites in the present embodiment, the positioning apparatus 1 may use other satellite positioning system, such as GLONASS (Global Navigation Satellite System).

Alternatively, the positioning apparatus 1 can also use communication systems other than satellite communication systems, such as positioning by means of communications with a plurality of base stations of cellular phone.

Moreover, although the positioning apparatus 1 corrects position data obtained by autonomous navigation by using the position data of two points obtained by positioning by the GPS in the embodiment described above, the positioning apparatus 1 can also correct the position data by using the position data of three or more points.

Moreover, also in the case of using GPS positioning data of two points, it is also possible to configure the positioning apparatus 1 to correct not only the calculated position data by the autonomous navigation in the period between the two points, but to correct the calculated position data by the autonomous navigation in the periods before and after the period between the two points pursuant to the correction of the calculated position data by the autonomous navigation which position data has been obtained in the period between the two points as reference points by the GPS.

Moreover, although a moving locus of a walker is cited as a concrete example in the positioning apparatus 1 of the embodiment described above, the positioning apparatus 1 can also be applied to ones for the other moving means, such as a bicycle.

Moreover, although the positioning apparatus 1 performs satellite positioning and autonomous navigation at almost the same time intervals in the embodiment described above, it is also possible to decrease the execution times of the satellite positioning to, for example, the half times of those of the autonomous navigation according to the moving speed of a mobile object.

Moreover, although the embodiment described above shows the mode of the positioning apparatus 1 in which the CPU 10 makes the GPS reception processing section 15, the autonomous navigation control processing section 21, the autonomous navigation correction processing section 22, the positional accuracy judgment processing section 23, and the like execute each piece of processing based on the program 12a stored in the ROM 12, all of the pieces of processing may be performed as software processing by the operations of the CPU 10.

Moreover, although the positioning apparatus 1 displays obtained path information and obtained error information in the display screen thereof in the embodiment described above, the positioning apparatus 1 may be configured to output these pieces of information as numeral value data to be capable of being used with a connected external device.

In addition, the details of the concrete configuration and numeral values that are shown in the present embodiment can suitably be changed without departing the spirit and scope of the present invention.

The entire disclosure of Japanese Patent Application No. 2010-195241 filed on Sep. 1, 2010 including description, claims, drawings, and abstract are incorporated herein by reference in its entirety.

Although various exemplary embodiments have been shown and described, the invention is not limited to the embodiments shown. Therefore, the scope of the invention is intended to be limited solely by the scope of the claims that follow.

The invention claimed is:

1. A positioning apparatus, comprising:
   a position measuring section which measures a present position of the positioning apparatus to obtain measured position data;
   a movement measuring section which measures a moving direction and a moving distance;
   a position calculating section which calculates the present position of the positioning apparatus to obtain calculated position data by accumulating, with respect to a reference position, moving data corresponding to the moving direction and the moving distance measured by the movement measuring section;
   a position selecting section which compares an error value of the measured position data with an error value of the calculated position data, and which selects one of the measured position data and the calculated position data that has a smaller error value than the other; and
   a reference position setting section which sets the measured position data obtained by the position measuring section as the reference position when the measured position data is selected by the position selecting section;
   wherein the error value of the calculated position data is set such that the error value increases in correspondence with increasing distance from the reference position.

2. The positioning apparatus according to claim 1, further comprising:
   a calculated position data storage section which sequentially stores the calculated position data calculated by the position calculating section; and
   a calculated position data correcting section which corrects each of the calculated position data stored in the calculated position data storage section, based on the reference position and a last reference position which was most recently set by the reference position setting section.

3. The positioning apparatus according to claim 2, wherein the calculated position data correcting section performs a rotation operation, and expansion and contraction operations for each of vectors from the last reference position to each of positions calculated by the position calculating section so that a vector from the last reference position to the calculated position calculated at a setting timing of the reference position set by the reference position setting section accords with a vector from the last reference position to the reference position.

4. The positioning apparatus according to claim 2, further comprising:
   an accuracy judging section which compares the error value of the measured position data and a predetermined threshold value to thereby judge whether or not the error value of the measured position data is higher than the threshold value;
   wherein, when the position selecting section selects the measured position data and the accuracy judging section judges that the error value of the measured position data is lower than the threshold value, the reference position setting section sets the measured position as a provisional reference position;
   wherein, after the provisional reference position has been set, when the accuracy judging section judges that the error value of the measured position data obtained newly by the position measuring section becomes higher than the threshold value within a predetermined period, the reference position setting section sets the newly measured position as the reference position; and
   wherein, after the provisional reference position has been set, when the accuracy judging section does not judge that the error value of the measured position data obtained newly by the position measuring section is higher than the threshold value within the predetermined period, the reference position setting section sets the provisional reference position as the reference position.

5. The positioning apparatus according to claim 4, wherein when the accuracy judging section judges that the error value of the measured position data obtained by the position measuring section is higher than the threshold value, the position selecting section selects the measured position data, and the reference position setting section sets the measured position data as the reference position.

6. The positioning apparatus according to claim 1, further comprising:
   a display section which displays the position data selected by the position selecting section and an error range based on the error value of one of the measured position data and the calculated position data.

7. A positioning method of obtaining position data based on measured position data from a position measuring section which measures a present position and moving data from a movement measuring section to which measures a moving direction and a moving distance as the moving data, the method comprising:
   calculating the present position to obtain calculated position data by accumulating, with respect to a reference position, the moving data corresponding to the moving direction and the moving distance;
   comparing an error value of the measured position data with an error value of the calculated position data, and selecting one of the measured position data and the calculated position data that has a smaller error value than the other; and
   setting the measured position data as the reference position when the measured position data is selected by the comparing;
   wherein the calculating index of the calculated position data is set such that the error value increases in correspondence with increasing distance from the reference position.

8. A non-transitory computer-readable storage medium having a program stored thereon for a computer to be used for a positioning apparatus, the positioning apparatus including a position measuring section which measures a present position of the positioning apparatus to obtain measured position data and a movement measuring section which measures a moving direction and a moving distance, and the program being executable to control the computer to function as sections comprising:
   a position calculating section which calculates the present position of the positioning apparatus to obtain calculated position data by accumulating, with respect to a reference position, moving data corresponding to the moving direction and the moving distance;
   a position selecting section which compares an error value of the measured position data with an error value of the calculated position data, and which selects one of the measured position data and the calculated position data that has a smaller error value than the other; and
   a reference position setting section which sets the measured position data as the reference position when the measured position data is selected by the position selecting section;
   wherein the program controls the computer to set the error value of the calculated position data such that the error value increases in correspondence with increasing distance from the reference position.

\* \* \* \* \*

UNITED STATES PATENT AND TRADEMARK OFFICE
CERTIFICATE OF CORRECTION

PATENT NO. : 8,805,642 B2  Page 1 of 1
APPLICATION NO. : 13/223955
DATED : August 12, 2014
INVENTOR(S) : Masao Sambongi It is certified that error appears in the above-identified patent and that said Letters Patent is hereby corrected as shown below:

In the Claims:

Column 16, Claim 7, Line 24 after "section" delete "to".

Signed and Sealed this
Tenth Day of February, 2015

Michelle K. Lee
*Deputy Director of the United States Patent and Trademark Office*